United States Patent [19]

Nagaoka

[11] Patent Number: 4,779,063
[45] Date of Patent: Oct. 18, 1988

[54] OSCILLATOR WITH FEEDBACK LOOP INCLUDING DELAY CIRCUIT

[75] Inventor: Hideo Nagaoka, Tokyo, Japan
[73] Assignee: NEC Corporation, Japan
[21] Appl. No.: 7,459
[22] Filed: Jan. 28, 1987
[30] Foreign Application Priority Data Jan. 24, 1986 [JP] Japan .................................. 61-14108

[51] Int. Cl.[4] .................................................. H03B 5/20
[52] U.S. Cl. .................................... 331/135; 331/108 B
[58] Field of Search ............ 331/108 B, 108 D, 117 R, 331/117 FE, 135, 167

[56] References Cited

U.S. PATENT DOCUMENTS

3,725,822  4/1973  Eaton, Jr. ..................... 331/135 X
4,272,736  6/1981  Gercekci et al. ............... 331/135 X Primary Examiner—Eugene R. Laroche
Assistant Examiner—Robert J. Pascal
Attorney, Agent, or Firm—Laff, Whitesel, Conte & Saret

[57] ABSTRACT

An oscillator comprising a delay circuit having an input terminal and an output terminal, and a tristate inverter having an input connected to the output terminal of the delay circuit and an output connected to the input terminal of the delay circuit. This tristate inverter is adapted to be switched by a control signal between an operable condition and an inoperable condition. A wave shaping inverter is connected to the output of the tristate inverter to generate a shaped pulse signal. Further, there is provided at least one tristate inverter having an input directly connected to an output of the tristate inverter itself so that it can generate a predetermined potential corresponding to the threshold of the tristate inverter itself. This voltage generating tristate inverter is connected at its output terminal to a selected one of the input and output terminals of the delay circuit. This voltage generating tristate inverter is adapted to be put in response to the control signal, when the first tristate inverter is put in the operable condition, in such a biasing mode as to generate the above predetermined voltage at the output terminal, and when the first tristate inverter is put in the operable condition, in such a floating mode as to bring its output terminal into a floating condition, so that the first tristate inverter oscillates because of a feedback given by the delay circuit.

22 Claims, 4 Drawing Sheets

OSCILLATOR WITH FEEDBACK LOOP INCLUDING DELAY CIRCUIT

BACKGROUND OF THE INVENTION

1. Field of the Invention

The present invention relates to an oscillator, and more specifically to an oscillator provided with a feedback loop including a delay circuit.

2. Description of the Related Art

For various purposes, signal delay has been given in different electronic circuits, devices and instruments, with various methods used to give the delay. Among the delay methods currently used, a method is frequently used in which pulses of a predetermined repetition frequency are generated while a set signal is supplied. The pulses thus generated are counted and when the count value reaches a predetermined value a delay signal is generated.

Heretofore, to realize the above delay signal generating method, an oscillator is constituted of an inverted amplifier having its output connected through a delay circuit to an input of the amplifier itself. The amplifier is adapted to be put in an operable condition during a period in which a set signal is applied, and maintained in an operable condition when the set signal is not applied, thus, while the set signal is applied an oscillation signal is generated in an oscillating loop composed of the delay circuit and the amplifier in the operable condition. The oscillation signal is applied to a shaping circuit, which in turn generates a train of pulses.

With the above circuit structure, the oscillation signal is gradually magnified in amplitude from the moment the oscillation starts until the oscillation reaches a steady state. In other words, a first cycle of oscillation signal is very small. Therefore, it does not often cross a threshold level of the shaping circuit, with the result that the shaping circuit will not generate a pulse corresponding to the first cycle of the oscillation signal. This will means that a delay signal generated when the pulses outputted by the shaping circuit are counted to a predetermined number will give a time period which is longer than a desired delay time.

In addition, the length of time from the moment the set signal is applied to the moment the first pulse is generated by the shaping circuit will vary in dependence upon the temperature characteristics of the amplifier and the shaping circuit. This means that the delay time will not be a constant.

SUMMARY OF THE INVENTION

Accordingly, it is an object of the present invention to provide an oscillator which has overcome the drawbacks of the conventional circuits.

Another object of the present invention is to provide an oscillator provided with a feedback loop including a delay circuit, which generates a first pulse at a predetermined constant time from application of a set or control signal.

Still another object of the present invention is to provide an oscillator having an oscillating circuit and a shaping circuit connected to the output of the oscillating circuit, which oscillator is constructed so that a first cycle of an oscillation signal generated by the oscillating circuit, will cross a threshold of the shaping circuit without exception.

A further object of the present invention is to provide such an oscillator which of necessity generates a first pulse at a predetermined constant time from an application of a signal for putting the oscillating circuit in an operable condition, without influence of temperature variation.

The above and other objects of the present invention are achieved in accordance with an oscillator comprising a delay circuit having an input terminal and an output terminal. A controlled inverted amplifier has an input connected to the output terminal of the delay circuit and an output connected to the input terminal of the delay circuit. The controlled amplifier is adapted to be switched between an operable condition and an inoperable condition in response to a control signal. A wave shaping circuit is connected to the output of the controlled amplifier to generate a shaped pulse signal. At least one controlled voltage generating circuit has its output terminal connected to a selected one of the input and output terminals of the delay circuit. When the amplifier is put in the inoperable condition, the voltage generating circuit is adapted to be in a biasing mode which generates a predetermined voltage at the output terminal when the amplifier is put in the operable condition, it is in a floating mode which brings its output terminal into a floating condition, so that the controlled amplifier oscillates because of a feedback given by the delay circuit.

With this arrangement, the predetermined voltage generated by the controlled voltage generating circuit is set so that when in the biasing mode, it is larger than a threshold of the controlled amplifier and a threshold of the shaping circuit, but is low enough to enables a first cycle of oscillation signal generated by the controlled amplifier to cross the threshold of the shaping circuit with a first quarter period of the first cycle. In this case, if the shaping circuit is adapted to generate a pulse in inverted relation to an input signal, the shaping circuit will generate a first positive pulse without a substantial delay time from the application of the control signal. Alternatively, it can be set so that the predetermined voltage generated by the controlled voltage generating circuit, when it is in the biasing mode, is smaller than a threshold of the controlled amplifier and a threshold of the shaping circuit, but high enough to enable a first cycle of oscillation signal generated by the controlled amplifier to cross the threshold of the shaping circuit within a first quarter period of the first cycle. In this case, if the shaping circuit is adapted to generate a pulse in an inverted relation to an input signal, the shaping circuit will generate a first negative pulse without a substantial delay time from the application of the control signal.

In a preferred embodiment, the oscillator includes a pair of controlled voltage generating circuits having their output terminals connected to the input and output terminals of the delay circuit, respectively. When the amplifier is put in the inoperable condition, these voltage generating circuits are adapted to be put in the biasing mode for generating the predetermined voltage at the respective output terminals. When the amplifier is put in the operable condition, in the floating mode to bring the respective output terminals into the floating condition, the controlled amplifier oscillates because of a feedback given by the delay circuit.

In a specific embodiment, the amplifier includes a first inverter of the tristate type having an input connected to the output terminal of the delay circuit and an output connected to the input terminal of the delay circuit. The first tristate inverter is switched by the control signal between an operable condition which allows the tristate inverter to oscillate by means of a feedback given by the delay circuit. A high output impedance condition maintains the output in a high impedance regardless of the condition of the input.

Further, the delay circuit includes a first capacitor connected at its one end to the input of the first inverter and grounded at its other end. A second capacitor is connected at its one end to the output of the first inverter and grounded at its other end. An inductor is connected between the one end of the first capacitor and the one end of the second capacitor. Preferably, the output of the first inverter is connected through a resistor to the one end of the second capacitor. The wave shaping circuit includes a second inverter such as a NOT circuit.

In one embodiment, the voltage generating circuit includes a third inverter of the tristate type having its output shortcircuited to its input. The output of the third inverter is connected to the selected terminal of the delay circuit. This third inverter is switched by the control signal between an operable condition is which the third inverter generates at the output a potential corresponding to a threshold of the third inverter itself and a high output impedance condition in which the output is put in a high impedance allowing oscillation of the first inverter. In this case, the threshold of the third inverter is set to be higher than the threshold of the first inverter and the threshold of the second inverter; but however, the threshold of the third invertor is low enough to allow a first cycle of oscillation signal to be generated by the first inverter and to cross the threshold of the second inverter within a first quarter period of the first cycle of oscillation signal. Alternatively, the threshold of the third inverter can be set smaller than the threshold of the first inverter and to threshold of the second inverter; however, the threshold of the third invertor is high enough to enable a first cycle of oscillation signal generated by the first inverter to cross the threshold of the second inverter within a first quarter period of the first cycle of oscillation signal.

In a more preferred embodiment, the voltage generating circuit includes third and fourth inverters of the tristate type each having an output shortcircuited to its output. The outputs of the third and fourth inverters are connected to the input and output terminals of the delay circuit, respectively. Each of the third and fourth inverters is switched by the control signal between an operable condition generating at the output a potential corresponding to a threshold of the inverter itself and a high output impedance condition which maintains the output in a high impedance for causing an oscillation of the first inverter. In this case, the thresholds of the third and fourth inverters should be larger than that of the first inverter and the threshold of the second inverter should be low enough to enable a first cycle of oscillation signal generated by the first inverter to cross the threshold of the second inverter within a first quarter period of the first cycle of oscillation signal. Alternatively, the thresholds of the third and fourth inverters are preferably smaller than that the thresholds of the first inverter and of the second inverter, but should be high enough to enable a first cycle of oscillation signal generated by the first inverter to cross the threshold of the second inverter within a first quarter period of the first cycle of oscillation signal.

Further, it is preferred that the first to fourth inverters include an inverting circuit of the same circuit structure. For example, the inverting circuit included in each of the first to fourth inverters can be constructed of a CMOS inverter which includes a p-channel MOS transistor having a source connected to a first supply voltage, a gate connected to the input of the inverting circuit itself and a drain connected to the output of the inverting circuit itself and an n-channel MOS transistor having a drain connected to the output of the inverting circuit itself, a gate connected to the input of the inverting circuit itself and a source connected to a second supply voltage.

In addition, each of the inverters of the tristate type can further include a second n-channel MOS transistor connected between the source of the first n-channel MOS transistor and the second supply voltage and having a gate adapted to receive a first control signal. A second p-channel MOS transistor is connected between the source of the first p-channel MOS transistor and the first supply voltage and having a gate adapted to receive a second control signal with a phase which is opposite to the phase of the first control signal.

Alternatively, each of the inverters of the tristate type can further include a second n-channel MOS transistor connected between the drain of the first n-channel MOS transistor and the output of the inverting circuit and having a gate adapted to receive a first control signal. A second p-channel MOS transistor is connected between the drain of the first p-channel MOS transistor and the output of the inverting circuit and has a gate adapted to receive a second control signal which a phase which is opposite to the phase of the first control signal.

According to another aspect of the present invention, an oscillator comprises a delay circuit having an input terminal and an output terminal, a first tristate inverter has an input connected to the output terminal of the delay circuit and an output connected to the input terminal of the delay circuit. The first tristate inverter is adapted to be switched by a control signal between an operable condition and an inoperable condition. A wave shaping second inverter connected to the output of the first tristate inverter to generate a shaped pulse signal. At lease one third tristate inverter has an input directly connected to an output of the third tristate inverter so that it can generate a predetermined potential corresponding to the threshold of the tristate inverter itself. The third tristate inverter is connected at its output terminal to a selected one of the input and output terminals of the delay circuit. The third tristate inverter is adapted to be put in a biasing mode responsive to the control signal, when the first tristate inverter is put in the inoperable condition. In such a biasing mode, the third tristate invertor generates the above predetermined voltate at the output terminal. When the first tristate inverter is put in the operable condition, in such a floating mode it brings its output terminal into a floating condition. The first tristate inverter oscillates because of a feedback given by the delay circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
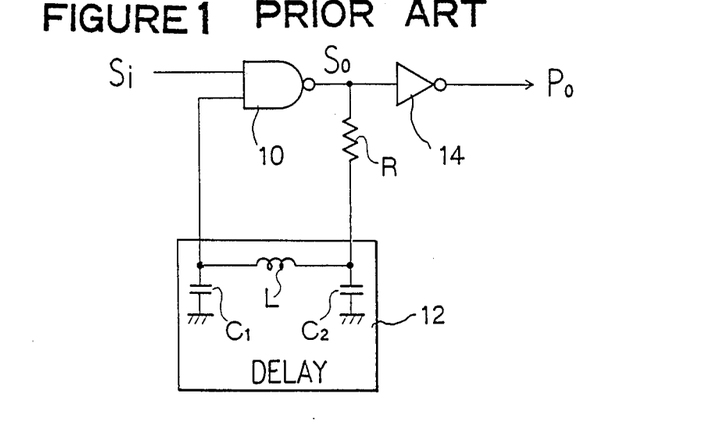
FIG. 1 is a circuit diagram of a conventional oscillator having a feedback loop formed of a delay circuit and a wave shaping inverter.

Referring to FIG. 1, there is shown a block diagram of a conventional oscillator having a feedback loop of a delay circuit. The shown oscillator comprises a two-input NAND circuit 10 receiving at its one input a control or set signal $S_i$. An output of the NAND circuit 10 is connected through a resistor R to one terminal of a delay circuit 12, which is in turn connected at its other terminal to another input of the NAND circuit 10. The delay circuit 12 includes a capacitor $C_1$ connected at its one end to the second input of the NAND circuit 10 and grounded at its other end. The one end of the capacitor $C_1$ is connected through an inductor L to the resistor R and one end of another capacitor $C_2$, which is grounded at its other end. In addition, the output of the NAND circuit 10 is connected to an input of a NOT circuit 14, which operates as a wave shaping circuit generating a pulse signal $P_o$.

In the above circuit, if the set signal $S_i$ is at a logical level "0", the NAND circuit 10 outputs a logical level "1" regardless of the logical level of the second input of the NAND circuit 10 connected to the delay circuit 12. Thus, the circuit shown in FIG. 1 does not oscillate.

If the set signal $S_i$ is brought to the logical level "1", the NAND circuit 10 operates as a NOT circuit which receives at its input the output of the delay circuit 12. The output of the NAND circuit 10 is fed back through the resistor R and the delay circuit 12 to the second input of the NAND circuit 10. Thus, a loop constituted of the NAND circuit 10, the resistor R and the delay circuit 12 will generate an oscillation signal $S_o$ at the output of the NAND circuit 10. Assuming that a total delay time given by the NAND circuit 10 and the delay circuit 12 is T, the period of the oscillation signal is 2T. In the above circuit, the resistor R acts to prevent a spurious oscillation, and therefore, it is preferred to insert the resistor R in the circuit.

Figure 2:
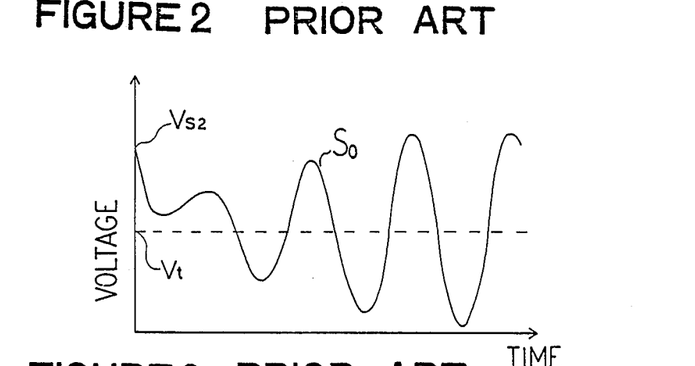
FIG. 2 is a diagram illustrating a waveform of an oscillation signal generated in the oscillator shown in FIG. 1.
Figure 3:
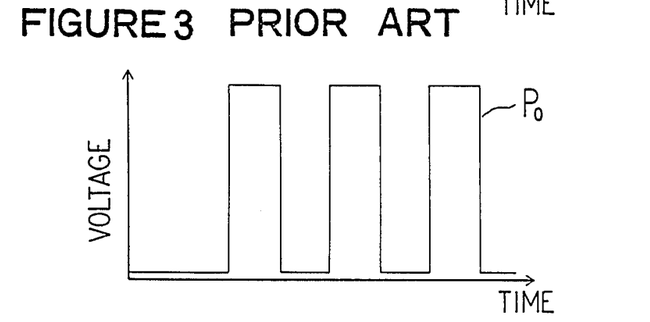
FIG. 3 is a diagram illustrating an output waveform of the wave shaping inverter shown in FIG. 1.

As mentioned above, the output of the NAND gate 10 is at the logical level "1" when the set signal $S_i$ is "0". Therefore, when the circuit starts oscillation, the oscillation signal $S_o$ appearing at the output of the NAND circuit 10 is at an initial voltage $V_{s2}$ of the logical level "1" (near to a supply voltage), as seen from the oscillation waveform diagram of the NAND circuit output shown in FIG. 2. On the other hand, the amplitude of the oscillation signal is gradually increased by action of the resistor R. As a result, the oscillation signal $S_o$ of the NAND circuit output assumes the waveform shown in FIG. 2. Namely, a first cycle of the oscillation signal $S_o$ does not cross a threshold level $V_t$ of the NOT circuit 14. As well known, the NOT circuit will change its output logic level when the input signal changes to cross the threshold $V_t$ of the NOT circuit. Accordingly, as mentioned above since the first cycle of oscillation signal $S_o$ does not cross the threshold level of the NOT circuit 14, the NOT circuit 14 does not generate a pulse corresponding to the first cycle of oscillation signal $S_o$, as seen from the output waveform diagram of the NOT circuit 14 shown in FIG. 3.

Now, assume that the pulses generated by the NOT circuit 14 is fed to a counter (not shown) so that a delay signal is generated when the count value reaches a preset number. In this case, if the preset value is determined on the basis of a required delay time and the frequency of the oscillation signal $S_o$ which is generated, the delay signal will be generated at a delayed time which is longer than the required delay time, since the NOT circuit 14 generates no pulse corresponding to the first cycle of the oscillation signal.

Furthermore, the NAND circuit 10 and the NOT circuit 14 have a temperature dependency. Therefore, the speed of the amplitude increase of the oscillation signal $S_o$ when the oscillation starts will vary in dependence of the temperature. On the other hand, the threshold of the NOT circuit will fluctuate dependent upon the temperature. Accordingly, from the moment the set signal $S_i$ is brought into the logical level "1" to the first pulse $P_o$ is outputted by the NOT circuit 14, the length of time will vary in dependence of the temperature. This will also result in a fluctuation of the delay time defined by a delay signal which would be generated when the output pulses of the NOT circuit 14 are counted to the preset value.

Figure 4:
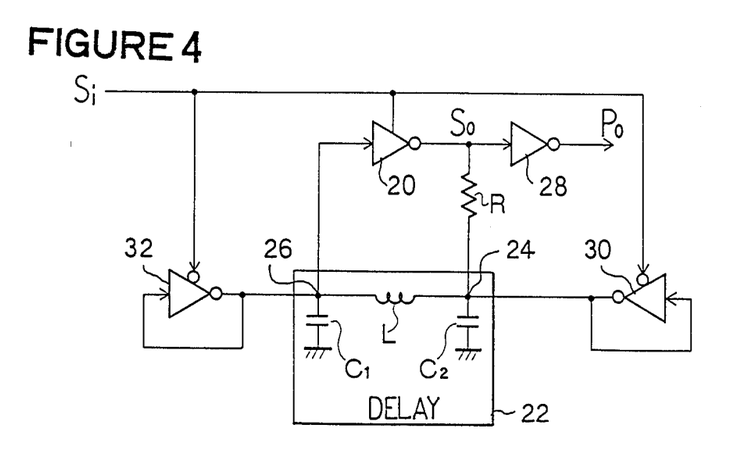
FIG. 4 is a circuit diagram of an embodiment of the oscillator in accordance with the present invention.

Turning to FIG. 4, there is shown a circuit diagram of one embodiment of the oscillator in accordance with the present invention. The shown circuit includes a tristate inverter 20 which receives at its control input a control or set signal $S_i$. This tristate inverter 20 is controlled by the set signal $S_i$ in such a manner that when the set signal $S_i$ is at a logical level "1". The tristate inverter 20 is put in an operable condition to function as an inverter. When the set signal $S_i$ is at a logical level "0", the tristate inverter 20 is put in an inoperable condition so as to have a high output impedance regardless of the level of an input signal.

The tristate inverter 20 has a signal output connected through a resistor R to one terminal 24 of a LC delay circuit 22, which is similar to the delay circuit 12 shown in FIG. 1. The other terminal 26 of the delay circuit 22 is connected to a signal input of the tristate inverter 20. Thus, when the tristate inverter 20 is in the operable condition, there is established an oscillating loop consisting of the tristate inverter 20, the resistor R and the delay circuit 22.

Further, the output of the tristate inverter 20 is connected to an input of a NOT circuit 28. This NOT circuit 28 functions as a wave shaping circuit to generate at its output a pulse signal $P_o$, as will be explained hereinafter.

In addition, the opposite terminals 24 and 26 of the delay circuit 22 are connected to the signal outputs of two tristate inverters 30 and 32, respectively, which in turn receive the set signal $S_i$ at the respective control inputs. Each of these tristate inverters 30 and 32 has a signal input directly connected to the signal output of the inverter itself. These inverters 30 and 32 are in a full feedback condition. Thus, when the set signal $S_i$ is at the logical level "1", each of the tristate inverters 30 and 32 is put in an inoperable condition in which it has a high output impedance and the signal output is internally isolated from the signal input. On the other hand, when the set signal $S_i$ is at the logical level "0", each of the tristate inverters 30 and 32 is put in an operable condition, as an inverter. In this condition, since these inverters are in the full feedback state as mentioned above, the signal outputs of the inverters are maintained at the respective thresholds of the inverters themselves. In other words, the tristate inverters 30 and 32 will become a voltage generating circuit.

Therefore, the tristate inverters 30 and 32 are adjusted to have the same threshold $V_{s1}$ so that the opposite terminals 24 and 26 are maintained at the same potential when the set signal $S_i$ is at the logical level "0". It is also adjusted such that the threshold $V_{s1}$ of the tristate inverters 30 and 32 is somewhat higher than the threshold $V_t$ of the NOT circuit 28 and a threshold of the tristate inverter 20.

The oscillator constructed as mentioned above operates as follows:

When the set signal $S_i$ is at the logical level "0", the tristate inverter 20 is put in the high output impedance condition, so that the oscillation loop is not established. On the other hand, the tristate inverters 30 and 32 are put in the operable condition to maintain the potential $V_{s1}$ at the terminals 24 and 26 of the delay circuit 22. Since the tristate inverter 20 and the NOT circuit 28 ordinarily have a high input impedance, both the signal input and the signal output $S_o$ of the tristate inverter 20 are maintained at the potential $V_{s1}$. Namely, the signal input of the NOT circuit 28 is held at the potential $V_{s1}$, which is higher than the threshold $V_t$ of the NOT circuit 28, so that the NOT circuit 28 maintains the output $P_o$ at a low logical level signal. Thus, the shown circuit will not oscillate.

When the set signal $S_i$ is at the logical level "1", the tristate inverter 20 operates as an inverter. On the other hand, the tristate inverters 30 and 32 are put in the high output impedance condition so that the opposite terminals 24 and 26 are not longer supplied with the voltage $V_{s1}$ and will not be influenced from the tristate inverters 30 and 32. Therefore, the output signal $S_o$ of the tristate inverter 20 is fed back through the resistor R and the delay circuit 22 to the input of the tristate inverter 20, so that the closed loop consisting of the tristate inverter 20, the resistor R and the delay circuit 22 will oscillate. The resulting oscillation signal $S_o$ is converted by the NOT circuit 28 into a pulse signal $P_o$. As mentioned hereinbefore, assuming that the total delay time of the tristate inverter 20 and the delay circuit 22 is T, the oscillation signal $S_o$ has the signal has the period of 2T.

Figure 5:
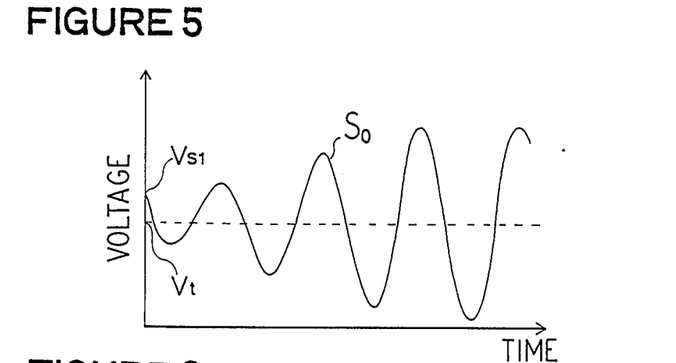
FIG. 5 is a diagram illustrating a waveform of a oscillation signal generated in the tristate inverter having a feedback loop of a delay circuit shown in FIG. 4.

FIG. 5 shows the waveform of the signal $S_o$ appearing at the output of the tristate inverter 20 when the shown circuit initiates oscillation. As will be apparent from the above explanation of the operation, when the circuit does not oscillate, the output voltage of the tristate inverter 20 is equal to the threshold $V_{s1}$ at the moment the set signal $S_i$ is brought to the logical level "1". This $V_{s1}$ is the threshold of the tristate inverters 30 and 32.

On the other hand, because of the resistor R, the amplitude of the oscillation signal $S_o$ outputted from the tristate inverter 20 gradually becomes larger. In other words, the first cycle of the oscillation signal has only a small amplitude. In addition, the NOT circuit 28 will not change the condition of its signal output unless the input signal $S_o$ changes to cross the threshold $V_t$ of the NOT circuit 28. Furthermore, it is preferred that, when the circuit first begins to oscillate, the output voltage of the tristate inverter 20 will change to approach the threshold $V_t$ of the NOT circuit 28, so that the NOT circuit will generate a first pulse as soon as possible after the set signal is brought to the logical level "1". For this purpose, since the threshold $V_{s1}$ is larger than the threshold $V_t$ of the NOT circuit 28, the threshold $V_{s1}$ is also required to be larger than the threshold of the tristate inverter 20, so that the output voltage of the tristate inverter 20 will decrease toward the threshold $V_t$ of the NOT circuit 28 just after the set signal $S_i$ is brought to the logical level "1".

Figure 6:
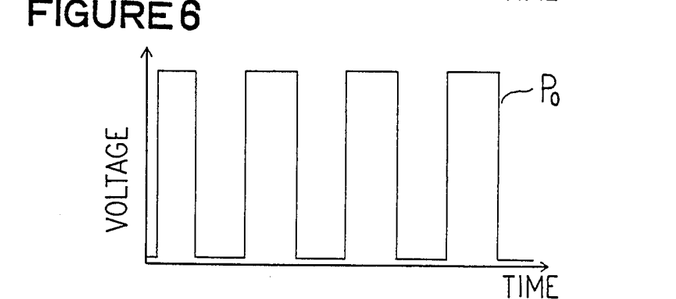
FIG. 6 is a diagram illustrating a waveform of the output of the wave shaping inverter shown in FIG. 4.

Accordingly, as mentioned hereinafter, the threshold $V_{s1}$ of the two tristate inverters 30 and 32 is set to be somewhat larger than both the threshold of the inverter 20 and the threshold $V_t$ of the NOT circuit 28 so that the first cycle of oscillation signal will cross the threshold $V_t$ of the NOT circuit 28 within a first quarter period of the same first cycle, as shown in FIG. 5. In other words, the threshold $V_{s1}$ of the tristate inverters 30 and 32 is larger than the threshold of the tristate inverter 20 and the threshold $V_t$ of the NOT circuit 28, but the threshold $V_{s1}$ is sufficiently low to allow the first cycle of oscillation signal $S_o$ appearing at the output of the tristate inverter 20 to cross the threshold $V_t$ of the NOT circuit 28 within a first quarter period of the same first cycle. Thus, the NOT circuit 28 generates a pulse signal $P_o$ from the first cycle of the oscillation signal $S_o$, as illustrated in the waveform diagram of the NOT circuit output signal shown in FIG. 6.

In the above mentioned oscillator circuit, the tristate inverters 20, 30 and 32 and the NOT circuit 28 can be constituted of semiconductor devices. If these inverters and NOT circuit are formed to have basically the same circuit structure, the thresholds of all the inverters and the NOT circuit can have the same temperature characteristics, so that relative operation conditions between the inverters and the NOT circuit will be not substantially changed by variations of the temperature. Therefore, the shown circuit can have a good temperature characteristics.

For example, each of the tristate inverters and the NOT circuit can include an inverting circuit constituted by a CMOS inverter of the same circuit structure. Each of the tristate inverters can further include a pair of analog switches in addition to the CMOS inverter.

Figure 7:
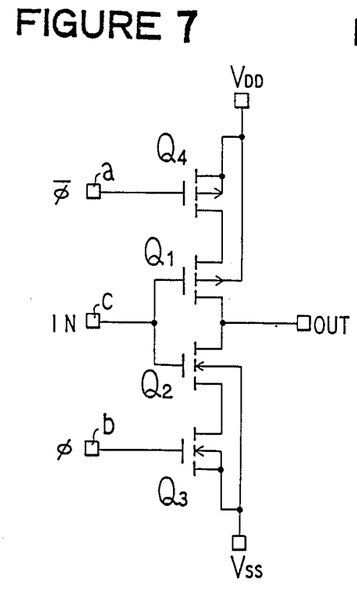
FIGS. 7, 7A, 8, 9A and 9B are circuit diagrams showing various circuit structures of the tristate inverter and the NOT circuit which can be used in the oscillator shown in FIG. 4.
Figure 7A:
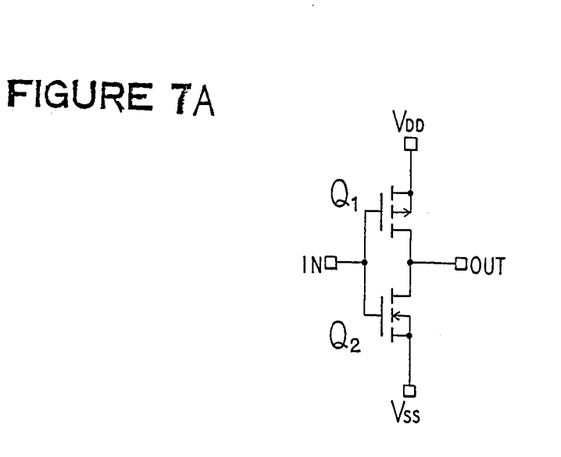

Referring to FIGS. 7 and 7A, the CMOS inverter can comprise a p-channel MOS transistor $Q_1$ having a gate connected to the input IN of the inverter and a drain connected to the output OUT of the inverter, and an n-channel MOS transistor $Q_2$ having a drain connected to the output OUT of the inverter and a gate connected to the input IN of the inverter.

In the case of the NOT circuit 28, as shown in FIG. 7A, the source of the p-channel MOS transistor $Q_1$ is connected to a drain supply voltage $V_{DD}$, and the source of the n-channel MOS transistor $Q_2$ is connected to a source supply voltage $V_{SS}$.

In the case of the tristate inverter, as shown in FIG. 7, an analog switch such as a second n-channel MOS transistor $Q_3$ is connected between the source of the n-channel MOS transistor $Q_2$ and the source supply voltage $V_{ss}$. A gate of the transistor $Q_3$ is connected to receive a first control signal $\phi$ corresponding to the set signal $S_i$. Further, another analog switch such as a second p-channel MOS transistor $Q_4$ is connected between the source of the first p-channel MOS transistor $Q_1$ and the drain supply voltage $V_{DD}$. This p-channel MOS transistor $Q_4$ receives at its gate a second control signal $\overline{\phi}$ in a phase which is opposite to the phase of the set signal $S_i$.

Thus, if the set signal $S_i$ is at the logical level "1" ($\phi=1$ and $\overline{\phi}=0$), both of the transistors $Q_3$ and $Q_4$ are put in an ON condition. Therefore, the CMOS inverter consisting of $Q_1$ and $Q_2$ can operates as an inverter. On the other hand, if the set signal $S_i$ is at the logical level "0" ($\phi=0$ and $\overline{\phi}=1$), both of the transistors $Q_3$ and $Q_4$ are OFF, so that the CMOS inverter of $Q_1$ and $Q_2$ is isolated from the voltage $V_{DD}$ and $V_{ss}$. Thus, the output OUT is put in a high impedance condition.

Figure 8:
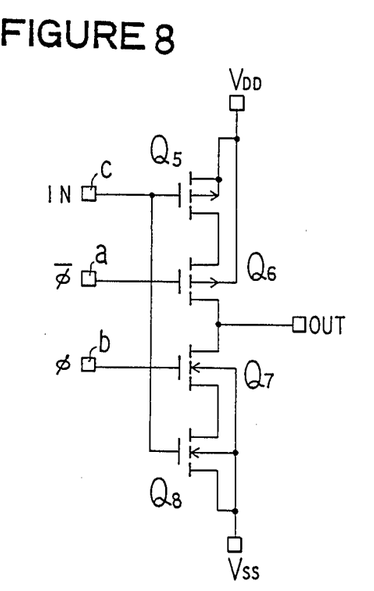

Turning to FIG. 8, there is shown another embodiment of the tristate inverter, which includes a p-channel MOS transistor $Q_5$ having its source connected to the drain supply voltage $V_{DD}$ and a gate connected to the input N of the inverter. A drain of the transistor $Q_5$ is connected to the output OUT of the inverter through another p-channel MOS transistor $Q_6$ whose gate is connected to receive the control signal $\overline{\phi}$ in opposite phase to the set signal $S_i$. The output OUT of the inverter is also connected through a pair of series-connected n-channel transistors $Q_7$ and $Q_8$ to the source supply voltage $V_{ss}$. A gate of the transistor $Q_7$ is connected to receive the control signal $\phi$ in phase with the set signal $S_i$. A gate of the transistor $Q_8$ is connected to the input N of the inverter.

With the above arrangement, the transistors $Q_5$ and $Q_8$ constitute a CMOS inverter. The transistors $Q_6$ and $Q_8$ function as an analog switch, respectively. If the set signal $S_i$ is at the logical level "1" ($\phi=1$ and $\overline{\phi}=0$), both of the transistors $Q_6$ and $Q_7$ are put in ON condition. Therefore, the CMOS inverter composed of transistors $Q_5$ and $Q_8$ functions as an inverter. However, if the set signal $S_i$ is at the logical level "0" ($\phi=0$ and $\phi=1$), both of the transistors $Q_6$ and $Q_7$ are put in OFF condition. As a result, the output OUT of the inverter is put in a floating condition. The output OUT has a high impedance.

Figure 9A:
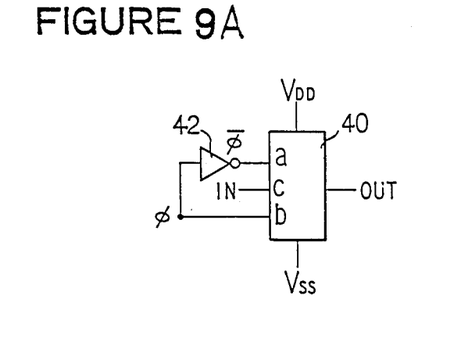
Figure 9B:
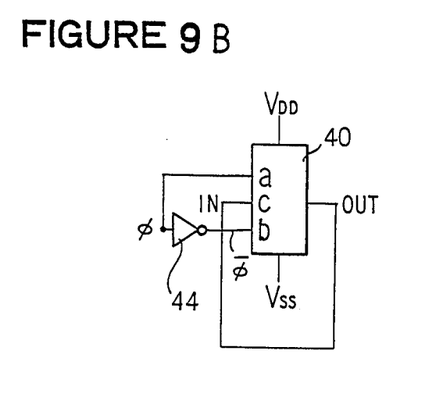

Referring to FIGS. 9A and 9B, the tristate inverters shown in FIG. 7 and 8 are represented by a block 40. If a control signal input $\phi$ of the tristate inverter 40 is connected through an inverter 42 to another control signal input $\overline{\phi}$ as shown in FIG. 9A, there can be easily realized a tristate inverter which can be used as the tristate inverter 20 shown in FIG. 4. On the other hand, as shown in FIG. 9B, if the control signal input $\overline{\phi}$ of the tristate inverter 40 is connected through an inverter 44 to the control signal input $\phi$ and the input IN is directly connected to the output OUT, a tristate inverter which can be used as the tristate inverters 30 and 32 shown in FIG. 4.

Again referring to FIG. 4, the signal input and the signal output of the tristate inverter 20 are connected through the resistor R and the inductor L. Therefore, even if one of the tristate inverters 30 and 32 is omitted, both the signal input and the signal output of the tristate inverter 20 will be returned to an appropriate initiating voltage $V_{s1}$ when a sufficient time has elapsed after set signal $S_i$ is brought to the logical level "0". Therefore, it is possible to omit either the tristate inverter 30 or 32.

If one of the tristate inverters 30 and 32 is omitted, the remaining tristate inverter will supply the voltage $V_{s1}$ through the delay circuit 22 to the terminal of the delay circuit 22 from which the tristate inverter voltage source has been removed. Therefore, a substantial time is required from when the oscillation stops to when the initiating voltage $V_{s1}$ is restored at the delay circuit terminal from which the tristate inverter voltage source has been removed. If the interval of time between oscillation and stop is short. It is preferable to couple the tristate inverter voltage sources 30 and 32 to the opposite terminals 24 and 26 of the delay circuit 22, respectively, as shown in FIG. 4. In addition, if the delay circuit 22 is constituted of a circuit which isolates, in a DC mode, between the opposite terminals 24 and 26, it is necessary to provide both of the tristate inverters 30 and 32.

The above mentioned embodiment is such that the output signal $P_o$ is maintained at a low level when it is out of oscillation. A positive-going pulse signal is generated at the output $P_o$ when the oscillation occurs. However, the oscillator can be such that the output signal $P_o$ is held at a high level when it is out of oscillation. A negative-going pulse signal is generated from the output $P_o$ in the oscillation condition. For this purpose, a pair of series-connected NOT circuits can be located in place of the NOT circuit 28. Alternatively, the threshold $V_{s1}$ of the tristate inverters 30 and 32 is adjusted to be somewhat smaller than the threshold of the tristate inverter 20 and the threshold $V_t$ of the NOT circuit 28. In this case, it is also preferred for the thresholds of the tristate inverters 30 and 32 to be smaller than the threshold of the tristate inverter 20 and the threshold of the NOT circuit 28, but is high enough to enable a first cycle of the oscillation signal outputted by the tristate inverter 20 to cross the threshold of the NOT circuit 28 within a first quarter period of the first cycle of oscillation signal.

As seen from the above description, when the oscillation starts, the initiating voltage of the oscillation loop is forcedly set at an appropriate potential by a controlled voltage generating means such as full-feedbacked tristate inverter. Therefore, a pulse signal is surely generated at a first cycle of the oscillation signal after application of the set signal.

The invention has thus been shown and described with reference to specific embodiments. However, it should be noted that the invention is in no way limited to the details of the illustrated structures but changes and modifications may be made within the scope of the appended claims.

I claim:

1. An oscillator comprising a delay circuit having an input terminal and an output terminal, a controlled inverted amplifier having an input connected to the output terminal of the delay circuit and an output connected to the input terminal of the delay circuit, the controlled amplifier being adapted to be switched between an operable condition and an inoperable condition in response to a control signal, the amplifier including a first invertor of the tristate type having an input connected to the output terminal of the delay circuit and an output connected to the input terminal of the delay circuit, the first tristate invertor being switched by the control signal between an operable condition which allows the tristate invertor to oscillate by means of a feedback given by the delay circuit and a high output impedance condition which maintains the output in a high impedance regardless of the condition of the input, the delay circuit including a first capacitor connected at its one end to the input of the first invertor and grounded at its other end, a second capacitor connected at its one end to the output of the first invertor and grounded at its other end, an inductor connected between the one end of the first capacitor and the one end of the second capacitor a wave shaping circuit connected to the output of the controlled amplifier to generate a shaped pulse signal, the wave shaping circuit including a second invertor, the threshold of the third invertor being larger than the threshold of the first and the threshold of the second invertor but not being low enough to enable a first cycle of oscillation signal generated by the first invertor to cross the threshold of the second invertor within a first quarter period of a first cycle, and at least one controlled voltage generating circuit having its output terminal connected to a selected one of the input and output terminals of the delay circuit, the voltage generating circuit including a third invertor of the tristate type having its output short circuited to its input, the output of the third invertor being connected to the selected terminal of the delay circuit, the third invertor being switched by the control signal between an operable condition in which the third invertor generates at its output a potential corresponding to a threshold of the third invertor itself and a high output impedance condition in which its output is put in a high impedance state enabling oscillation of the first invertor, the voltage generating circuit being adapted to be put in a biasing mode to generate a predetermined voltage at its output terminal when the amplifier is put in its inoperable condition, and when the amplifier is put in the operable condition, in such a floating mode to bring its output terminal into a floating condition, so that the controlled amplifier oscillates because of a feedback given by the delay circuit.

2. An oscillator claimed in claim 1 wherein the output of the first inverter is connected through a resistor to the one end of the second capacitor.

3. An oscillator comprising a delay circuit having an input terminal and an output terminal, a controlled inverted amplifier having an input connected to the output terminal of the delay circuit and an output connected to the input terminal of the delay circuit, the controlled amplifier being adapted to be switched between an operable condition and an inoperable condition in response to a control signal, the amplifier including a first invertor of the tristate type having an input connected to the output terminal of the delay circuit and an output connected to the input terminal of the delay circuit, the first tristate invertor being switched by the control signal between an operable condition which allows the tristate invertor to oscillate by means of a feedback given by the delay circuit and a high output impedance condition which maintains the output in a high impedance regardless of the condition of the input, a wave shaping circuit connected to the output of the controlled amplifier to generate a shaped pulse signal, the wave shaping circuit including a second invertor, and at least one controlled voltage generating circuit having its output terminal connected to a selected one of the input and output terminals of the delay circuit, a generating circuit including third and fourth inverters of the tristate type, each of said tristate inverters having its output short-circuited to its input, the outputs of the third and fourth inverters being connected to the input and output terminals of the delay circuit, respectively, each of the third and fourth inverters being switched by the control signal between an operable condition generating at its output a potential corresponding to a threshold of the invertor itself and a high output impedance condition which maintains its output in a high impedance for enabling an oscillation of the first invertor, the voltae generating circuit being adapted to be put in a biasing mode to generate a predetermined voltage at its output terminal when the amplifier is put in its inoperable condition, and when the amplifier is put in the operable condition, in such a floating mode to bring its output terminal into a floating condition, so that the controlled amplifier oscillates because of a feedback given by the delay circuit.

4. An oscillator claimed in claim 3 wherein the thresholds of the third and fourth inverters are larger than that of the first inverter and that of the second inverter but are low enough to allow a first cycle of oscillation signal generated by the first inverter to cross the threshold of the second inverter within a first quarter period of the first cycle.

5. An oscillator claimed in claim 4 wherein the first to fourth inverters include an inverting circuit of the same circuit structure.

6. An oscillator claimed in claim 5 wherein the inverting circuit included in each of the first to fourth inverters includes a p-channel MOS transistor having a source connected to a first supply voltage, a gate connected to the input of the inverter and a drain connected to the output of the inverter and an n-channel MOS transistor having a drain connected to the output of the inverter, a gate connected to the input of the inverter and a source connected to a second supply voltage.

7. An oscillator claimed in claim 6 wherein each of the first, third and fourth inverters further includes a second n-channel MOS transistor connected between the source of the first n-channel MOS transistor and the second supply voltage and having a gate adapted to receive a first control signal, and a second p-channel MOS transistor connected between the source of the first p-channel MOS transistor and the first supply voltage and having a gate adapted to receive a second control signal in opposite phase to the first control signal.

8. An oscillator claimed in claim 7 wherein the gate of the second p-channel MOS transistor receives through another inverter the first control signal.

9. An oscillator claimed in claim 6 wherein each of the first, third and fourth inverters further includes a second n-channel MOS transistor connected between the drain of the first n-channel MOS transistor and the output of the inverter and having a gate adapted to receive a first control signal, and a second p-channel MOS transistor connected between the drain of the first p-channel MOS transistor and the output of the inverter and having a gate adapted to receive a second control signal in opposite phase to the first control signal.

10. An oscillator claimed in claim 9 wherein the gate of the second p-channel MOS transistor receives through another inverter the first control signal.

11. An oscillator comprising a delay circuit having an input terminal and an output terminal, a controlled inverted amplifier having an input connected to the output terminal of the delay circuit and an output connected to the input terminal of the delay circuit, the controlled amplifier being adapted to be switched between an operable condition and an inoperable condition in response to a control signal, a wave shaping circuit connected to the output of the controlled amplifier to generate a shaped pulse signal, and at least one controlled voltage generating circuit having its output terminal connected to a selected one of the input and output terminals of the delay circuit, the controlled voltage generating circuit generating at its output a potential which is larger than a threshold of the controlled amplifier and a threshold of the shaping circuit but which is low enough to enable a first cycle of oscillation signal generated by the controlled amplifier to cross the threshold of the wave shaping circuit within a first quarter cycle of the first cycle of oscillation signal, the voltage generating circuit being adapted to be put in a biasing mode to generate a predetermined voltage at its output terminal when the amplifier is put in its inoperable condition, and when the amplifier is put in the operable condition, in such a floating mode to bring its output terminal into a floating condition, so that the controlled amplifier oscillates because of a feedback given by the delay circuit.

12. An oscillator comprising a delay circuit having an input terminal and an output terminal, a first tristate invertor having an input connected to the output terminal of the delay circuit and an output connected to the input terminal of the delay circuit, the delay circuit including a first capacitor connected at its one end to the input of the first invertor and grounded at its other end, a second capacitor connected at its one end to the output of the first invertor and grounded at its other end, and an inductor connected between the one end of the first capacitor and the one end of the second capacitor, the output of the first invertor being connected through a resistor to the one end of the second capacitor, the first tristate invertor being adapted to be switched by a control signal between an operable condition and an inoperable condition, a wave shaping second invertor connected to the output of the first tristate invertor to generate a shaped pulse signal, and at least one third tristate invertor having an input directly connected to an output of the third tristate invertor so that it can generate a predetermined potential corresponding to the threshold of the tristate invertor itself, the threshold of the third invertor being higher than the thresholds of the first invertor and of the second invertor but being low enough to enable a first cycle of oscillation signal generated by the first invertor to cross the threshold of the second invertor within a first quarter period of the first cycle, the third tristate invertor being connected at its output terminal to a selected one of the input and output terminals of the delay circuit, the third tristate invertor being adapted to be put in a biasing mode in response to the control signal, when the first tristate invertor is put in the inoperable condition, said third tristate invertor in said biasing mode generating the predetermined voltage at its output terminal, and when the first tristate invertor in put in the operable condition, it assumes a floating mode which brings its output terminal into a floating condition, so that the first tristate invertor oscillates because of a feedback given by the delay circuit.

13. An oscillator comprising a delay circuit having an input terminal and an output terminal, a first tristate invertor having an input connected to the output terminal of the delay circuit, the first tristate invertor being adapted to be switched by a control signal between an operable condition and an inoperable condition, a wave shaping second invertor connected to the output of the first tristate invertor to generate a shaped pulse signal, and a pair of third inverters of the tristate type each having an output short circuited to its input, the outputs of the third inverters being connected to the input and output terminals of the delay circuit, respectively, each of the third inverters being switched by the control signal between an operable condition for generating at the output a potential corresponding to a threshold of the invertor itself and a high output impedance condition which maintains the output in a high impedance for enabling an oscillation of the first invertor, in order to generate a predetermined potential corresponding to the threshold of the tristate inverters themselves, the third tristate inverters being connected at their output terminals to a selected one of the input and output terminals of the delay circuit, the third tristate invertor being adapted to be put in a biasing mode in response to the control signal, when the first tristate invertor is put in the inoperable condition, said third tristate invertor in said biasing mode generating the predetermined voltage at their output terminal, and when the first tristate invertor is put in the operable condition, it assumes a floating mode which brings its output terminal into a floating condition, so that the first tristate invertor oscillates because of a feedback given by the delay circuit.

14. An oscillator claimed in claim 13 wherein the thresholds of the third inverters are larger than that of the first inverter and that of the second inverter but are low enough to allow a first cycle of oscillation signal generated by the first inverter to cross the threshold of the second inverter within a first quarter period of the first cycle.

15. An oscillator claimed in claim 14 wherein the first to fourth inverters include an inverting circuit of the same circuit structure.

16. An oscillator claimed in claim 15 wherein the inverting circuit included in each of the first to fourth inverters includes a p-channel MOS transistor having a source connected to a first supply voltage, a gate connected to the input of the inverter and a drain connected to the output of the inverter and an n-channel MOS transistor having a drain connected to the output of the inverter, a gate connected to the input of the inverter and a source connected to a second supply voltage.

17. An oscillator claimed in claim 16 wherein each of the first, third and fourth inverters further includes a second n-channel MOS transistor connected between the source of the first n-channel MOS transistor and the second supply voltage and having a gate adapted to receive a first control signal, and a second p-channel MOS transistor connected between the source of the first p-channel MOS transistor and the first supply voltage and having a gate adapted to receive a second control signal in opposite phase to the first control signal.

18. An oscillator claimed in claim 16 wherein each of the first, third and fourth inverters further includes a second n-channel MOS transistor connected between the drain of the first n-channel MOS transistor and the output of the inverter and having a gate adapted to receive a first control signal, and a second p-channel MOS transistor connected between the drain of the first p-channel MOS transistor and the output of the inverter and having a gate adapted to receive a second control signal in opposite phase to the first control signal.

19. An oscillator comprising a delay circuit having an input terminal and an output terminal, a controlled inverter amplifier having an input connected to the input terminal of the delay circuit, the controlled amplifier being switched between an operable condition and inoperable condition in response to a control signal, a wave shaping circuit connected to the output of the controlled inverted amplifier to generate a shaped pulse signal, and a pair of controlled voltage generating means connected to the input and the output of the controlled inverted amplifier, respectively, the controlled voltage generating means being controlled to forcedly bias the input and the output of the controlled inverted amplifier at the same potential which is slightly higher than a threshold voltage of the controlled inverted amplifier, when the controlled inverted amplifier is in the inoperable condition, and on the other hand, to put the input and the output of the controlled inverted amplifier in a floating condition when the controlled inverted amplifier is in the operable condition, so that the controlled inverted amplifier oscillates because of a feedback through the delay circuit.

20. An oscillator claimed in claim 19 wherein the wave shaping circuit includes a second inverter.

21. An oscillator claimed in claim 20 wherein the voltage generating circuit includes third and fourth inverters of the tristate type each having an output short-circuited to its output, the outputs of the third and fourth inverters being connected to the input and output terminals of the delay circuit respectively, each of the third and fourth inverters being switched by the control signal between an operable condition generating at the output a potential corresponding to a threshold of the inverter itself and a high output impedance condition which maintains the output in a high impedance allowing oscillation of the first inverter.

22. An oscillator claimed in claim 21 wherein the thresholds of the third and fourth inverters are larger than that of the first inverter and that of the second inverter but is low enough to allow a first cycle of oscillation signal generated by the first inverter to cross the threshold of the second inverter within a first quarter period of the first cycle.

* * * * *